United States Patent [19]

Cronin et al.

[11] Patent Number: 5,213,916

[45] Date of Patent: May 25, 1993

[54] METHOD OF MAKING A GRAY LEVEL MASK

[75] Inventors: John E. Cronin, Milton; Paul A. Farrar, Sr., Burlington; Carter W. Kaanta, Colchester; James G. Ryan, Essex Junction; Andrew J. Watts, Milton, all of Vt.

[73] Assignee: International Business Machines Corporation, Armonk, N.Y.

[21] Appl. No.: 605,606

[22] Filed: Oct. 30, 1990

[51] Int. Cl.⁵ ............................................. G03F 9/00
[52] U.S. Cl. ........................................ 430/5; 430/320; 430/321; 430/324
[58] Field of Search ................ 430/5, 313, 316, 317, 430/320, 321, 324

[56] References Cited

U.S. PATENT DOCUMENTS

| | | | |
|---|---|---|---|
| 3,649,393 | 3/1973 | Hatzakis | 156/3 |
| 3,875,321 | 4/1975 | Gliemeroth et al. | 428/432 |
| 3,930,857 | 1/1976 | Bendz et al. | 96/36.2 |
| 4,018,938 | 4/1977 | Feder et al. | 430/5 |
| 4,040,891 | 8/1977 | Chang et al. | 156/651 |
| 4,434,191 | 2/1984 | Cook et al. | 427/165 |
| 4,440,841 | 4/1984 | Tabuchi | 430/5 |
| 4,507,393 | 3/1985 | Kassner et al. | 501/75 |
| 4,554,259 | 11/1985 | Franklin et al. | 501/67 |
| 4,567,104 | 1/1986 | Wu | 428/410 |
| 4,609,632 | 9/1986 | Sack | 501/61 |
| 4,670,366 | 6/1987 | Wu | 430/13 |
| 4,684,436 | 8/1987 | Burns et al. | 156/643 |
| 4,686,162 | 8/1987 | Stangl et al. | 430/5 |
| 4,720,442 | 1/1988 | Shinkai et al. | 430/5 |
| 4,722,878 | 2/1988 | Watakabe et al. | 430/5 |
| 4,764,432 | 8/1988 | Kalbitzer | 428/446 |
| 4,764,441 | 8/1988 | Ohta et al. | 430/5 |
| 4,769,347 | 9/1988 | Cook et al. | 501/64 |
| 4,770,739 | 9/1988 | Orvek et al. | 156/643 |
| 4,820,326 | 4/1989 | Speit | 65/30.11 |
| 4,894,303 | 1/1990 | Wu | 430/13 |

OTHER PUBLICATIONS

Cronin, J. E. et al., "Defining Stepped Resist Structure Using E-Beam and Implemented With Proximity Correction Software", IBM Tech. Discl. Bull., vol. 31, No. 7, (Dec. 1988), pp. 286–287.

*Primary Examiner*—Marion E. McCamish
*Assistant Examiner*—S. Rosasco
*Attorney, Agent, or Firm*—Perman & Green

[57] ABSTRACT

A gray level mask suitable for photolithography is constructed of a transparent glass substrate which supports plural levels of materials having different optical transmissivities. In the case of a mask employing only two of these levels, one level may be constructed of a glass made partially transmissive by substitution of silver ions in place of metal ions of alkali metal silicates employed in the construction of the glass. The second layer may be made opaque by construction of the layer of a metal such as chromium. The mask is fabricated with the aid of a photoresist structure which is etched in specific regions by photolithographic masking to enable selective etching of exposed regions of the level of materials of differing optical transmissivities. Various etches are employed for selective etching of the photoresist, the metal of one of the layers, and the glass of the other of the layers. The etches include plasma etch with chloride ions to attack the chromium of the opaque layer, compounds of fluorine to attack the glass layer, and reactive ion etching with oxygen to attack the photoresist structure. Also, developer is employed for etching on hardened regions of resist in the photoresist structure.

25 Claims, 5 Drawing Sheets

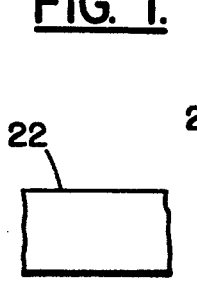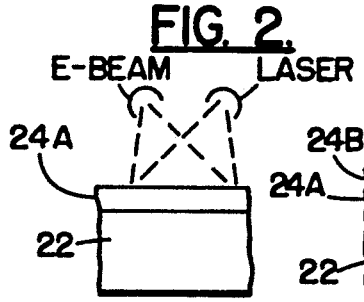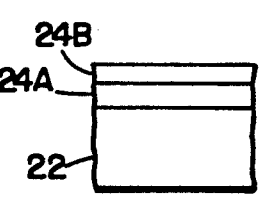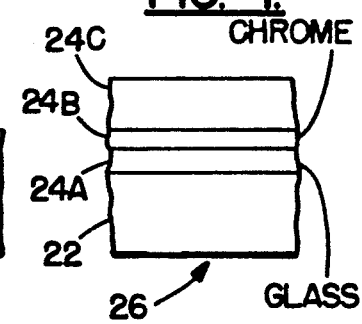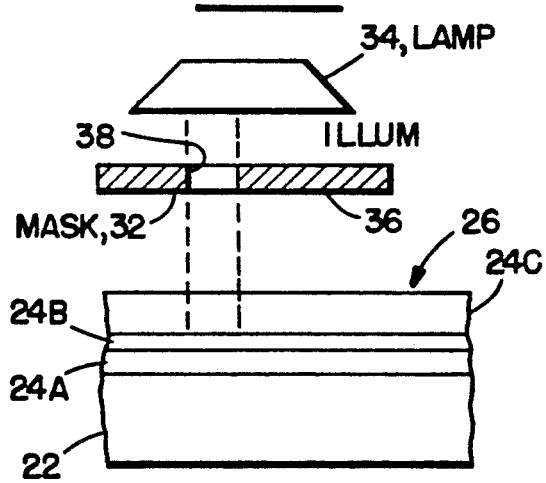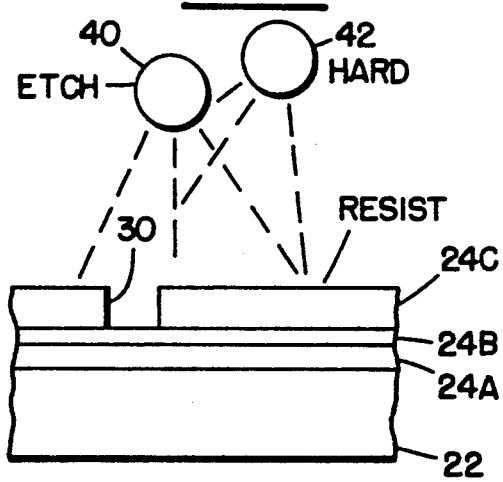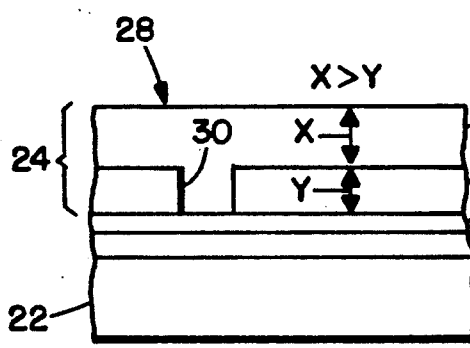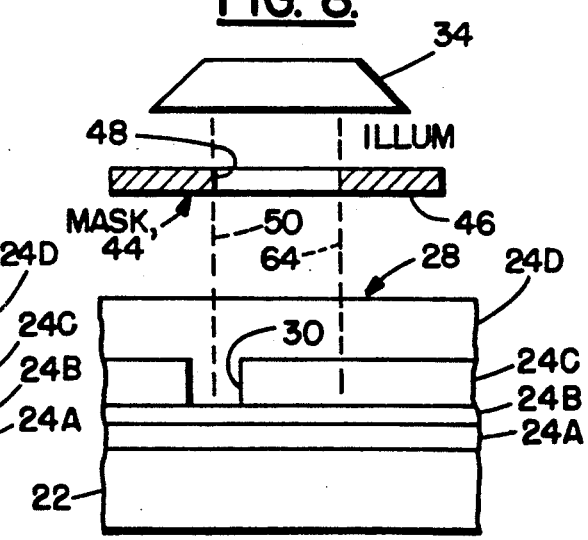

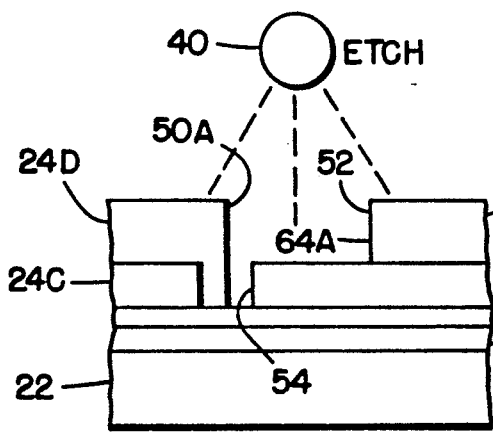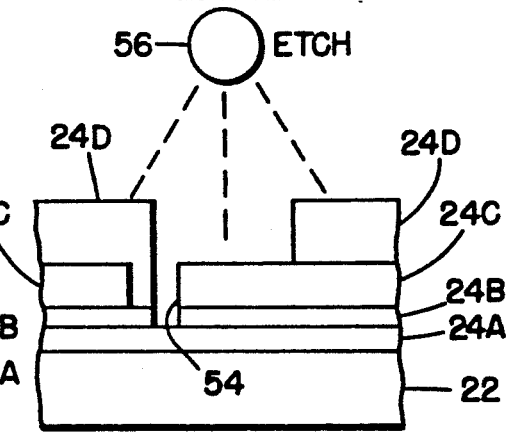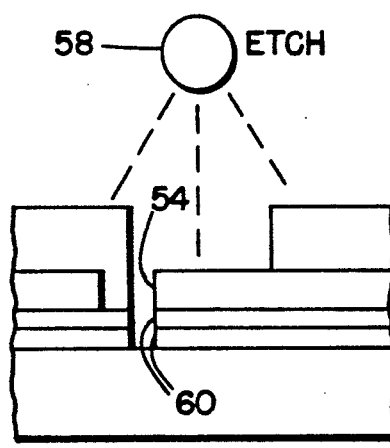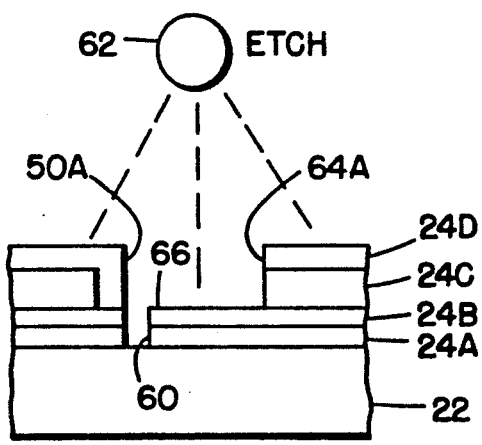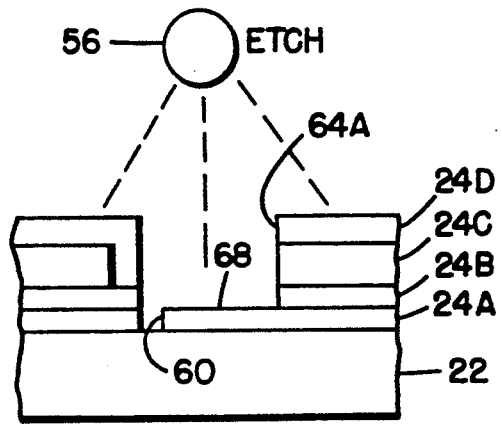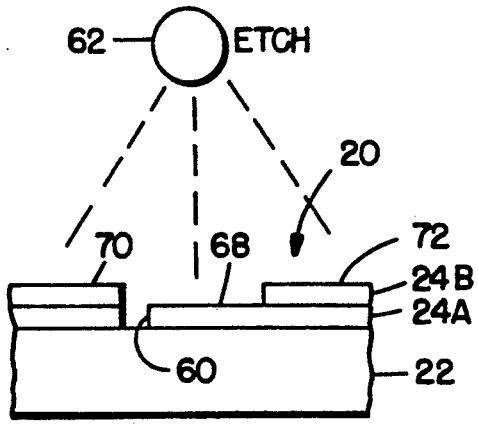

METHOD OF MAKING A GRAY LEVEL MASK

BACKGROUND OF THE INVENTION

This invention relates to the formation of masks useful in photolithography for the fabrication of semiconductor devices, and more particularly, to a construction of masks having regions of material of different optical opacity, the regions being arranged typically as a succession of layers.

In the use of photolithography for the construction of semiconductor devices as well as other devices such as masks and reticles, the construction process involves numerous steps which include the exposure of photoresist through a mask to delineate specifically shaped areas which are to be etched. There are situations in which a plurality of exposure steps are to be performed sequentially with a plurality of masks to accomplish differing amounts of exposure of the various areas to be etched.

The manufacturing process can be simplified by reduction of the number of exposure steps by use of a gray level mask. A gray level mask allows a defining of two or more conventional mask levels in a single exposure step. This technique lends itself to process clustering with its potential for low defect density, and also facilitates manufacture by reducing the number of masking levels required. The technique also reduces tolerances between gray level patterns. By way of example, an important use of gray level mask technology is for recessed multilevel wiring applications where via and wiring patterns may be produced with one exposure.

A problem arises with presently available gray level masks in that the masks are difficult to fabricate and, furthermore, produce inadequate image quality in many applications. By way of example in the fabrication of a gray level mask, it has been the practice to form the mask by an array of spaced-apart chromium islands in the nature of a half-tone screen wherein each chromium island is opaque to ultraviolet radiation while spaces between the islands allow passage of the radiation. The half-tone screen is constructed by use of electron-bream lithography so as to produce spaces between the islands wherein the spaces have dimensions smaller than a wavelength of the optical radiation. The islands may also have dimensions smaller than the wavelength of the optical radiation. As a result, there is a significant attenuation of the optical radiation transmitted through the mask. The resulting transmissivity of the mask is significantly more than that of a totally opaque mask region and significantly less than that of a totally transparent mask region. Thus, the resulting mask is a gray level mask, but a mask which produces a lower quality image than is desired. The amount of transmissivity is defined by the dimensions of the chromium islands and the spaces.

A further disadvantage of the foregoing gray level mask is the fact that images formed in the gray areas have sloped sidewalls which are unacceptable for use in producing semiconductor products requiring the higher resolution for condensed packaging of circuit elements as are being contemplated for the near future. With respect to other techniques which have been employed in the fabrication of gray level masks, there has been the disadvantage that the other fabrication methods require precise electron-beam dose control to make optical masks or electron-beam proximity correction, and produce gray layers of specific opacity.

SUMMARY OF THE INVENTION

The aforementioned problem is overcome and other advantages are provided by a construction of gray level mask which, in accordance with the invention, employs materials having differing opacity to visible light. The term "light" as used herein is understood to include those portions of the spectrum, such as visible and ultraviolet light which are used in photolithographic processes for construction of electric circuits in semiconductor chips. Furthermore, the materials are selected in combination with specific etching agents which differentially attack a specific one of the materials without attacking the other materials. This permits the mask to be produced by conventional means of photolithography wherein regions of the various materials can be deposited in selected regions of the mask, as well as in a succession of layers superposed on each other.

The invention is advantageous because the fabrication of the gray level mask can be accomplished by use of optical, x-ray, or electron beam lithography techniques to produce a desired pattern of regions of various opacity upon the mask. It is understood that the principles of the invention can be employed in the fabrication of other structures similar to a mask, such as a reticle.

BRIEF DESCRIPTION OF THE DRAWING

The aforementioned aspects and other features of the invention are explained in the following description, taken in connection with the accompanying drawing wherein:

FIGS. 1–14 show a succession of steps in the fabrication of a mask in accordance with the invention, the steps being indicated diagrammatically;

DETAILED DESCRIPTION

Figure 15:
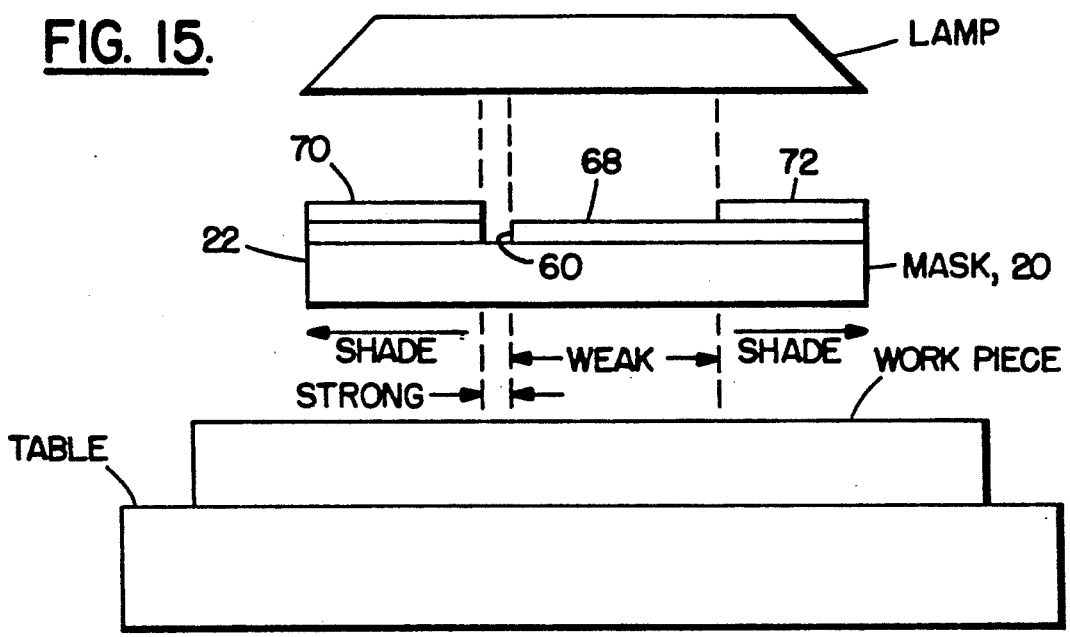
FIG. 15 shows, diagrammatically, a photolithographic system employing the mask (as a reticle) of the invention.

The procedure for fabrication of a gray level mask 20, shown in completed form in FIGS. 14 and 15, is accomplished in accordance with the invention, as shown in FIGS. 1–14. The procedure begins with a substrate 22 (FIG. 1) upon which is deposited a succession of three layers of material, namely, a first layer 24A, a second layer 24B, and a third layer 24C to provide a structure 26 (FIG. 4). A further layer 24D is subsequently deposited to provide a further structure 28 (FIG. 7). In the structure 28, the substrate 22 supports a set of four layers 24. The third layer 24C has an opening 30 filled with material of the fourth layer 24D. In the ensuing description, the legend 24 may be employed to identify the layers generally, with the suffixes A–D being employed to identify specific ones of the layers. The structures 26 and 28 are employed with various lithographic steps (FIGS. 5 and 8) and etching steps (FIGS. 6 and 9–14) to produce the completed mask 20.

The fabrication procedure is described now in greater detail. With reference to FIG. 1, the substrate 22 is constructed, typically, of a transparent material, such as glass, which is suitable for use in lithographic procedures employed in various manufacturing processes such as the fabrication of semiconductor devices, masks and reticles, by way of example, wherein the mask 20 may be used to advantage. In FIG. 2, the first layer 24A is deposited upon the top surface of the substrate 22.

The first layer 24A is fabricated of a material which has greater opacity and reduced transmissivity to the propagation of radiation such as light than does the material of the substrate 22. A similar mask structure built with different materials may be suitable for x-radiation. Preferably, the material of the first layer 24A comprises a glass which has been doped with an optical transmission inhibitor such as a coloring agent or a darkening agent which inhibits the propagation of light so as to reduce the optical transmissivity of the first layer 24A to a fraction of the transmissivity of the substrate 22, while still permitting a significant amount of light to propagate through the first layer 24A. By way of example, the optical transmissivity of the second layer 24A may have a value lying in a range of $\frac{1}{8}-\frac{7}{8}$ the optical transmissivity of the substrate 22.

It has been found useful, in accordance with a preferred embodiment of the invention, to fabricate the first layer 24A of a glass material constructed in accordance with the teaching of three U.S. Pat. Nos. to Wu, namely, 4,894,303; 4,670,366; and 4,567,104. In the Wu patents, there is an exchange of silver ion with the metal ions of alkali metal silicates and oxides employed in the glass. Characteristics of the base glass composition, particularly the light transmissivity, can be varied by photoreduction of silver ions. A useful feature of the glass is the fact that the amount of light transmissivity can be adjusted by exposure to an electron beam for darkening the glass, and by exposure to heat above approximately 200 degrees Celsius for recovering transparency. The first layer 24A may be referred to as a filter glass. The capacity for darkening by use of the electron-beam radiation, and the capacity for regaining transparency by heating with a laser are indicated in simple fashion diagrammatically in FIG. 2, and are explained in further detail subsequently with reference to FIGS. 16–18.

In FIG. 3, the second layer 24B is deposited on the top surface of the first layer 24A. The deposition of both of the layers 24A and 24B are accomplished in accordance with well-known practice in the manufacture of multiple-layered semiconductor devices. The optical transmissivity of the material of the second layer 24B is less than that of the first layer 24A. By way of example, the optical transmissivity of the second layer 24B has a value lying in a range of $\frac{1}{4}$ the optical transmissivity of the substrate 22 to zero transmissivity, a zero transmissivity being obtained by making the second layer 24B opaque. By way of example in the construction of the mask 20, the preferred embodiment of the mask 20 has been fabricated by constructing the second layer 24B of an opaque material, namely, a layer of metal, preferably chromium. The respective thicknesses of the layers 24A and 24B are selected as a matter of convenience in the process of manufacturing the mask 20, a suitable range of thickness for each of the layers 24A and 24B being the range of approximately 0.05 micron to $\frac{1}{2}$ millimeter.

In FIG. 4, the third layer 24C is deposited upon the top surface of the second layer 24B. The layer 24C comprises resist material, such as photoresist which is deposited by use of conventional techniques well-known in the manufacture of semiconductor devices. The layer 24C may be referred to as Resist 1. The step in FIG. 4 is the first of a sequence of steps for providing a resist structure comprising a plurality of layers of resist material. A second resist layer of the resist structure is shown as a fourth layer 24D in FIG. 7. A feature in the construction of the resist structure is the configuring of the third layer 24C to provide the opening 30 prior to deposit of the fourth layer 24D.

FIGS. 5 and 6 show, respectively, photolithography and etching steps employed in configuring the layer 24C to provide the opening 30. FIG. 6 also shows a step of hardening the photoresist material of the third layer 24C subsequent to the etching process. In FIG. 5, the photolithography employs a mask 32 and a source of radiation such as light or electron-beam or x-radiation represented by a lamp 34, the mask 32 having an opaque region 36 and a transparent, or open, region 38. The lamp 34 and the mask 32 are arranged above the structure 26 with the mask 32 being disposed between the lamp 34 and the third layer 24C. Light from the lamp 34 is directed toward the mask 32 with rays of the light propagating through the transparent region 38 to impinge upon a layer 24C of the photoresist. The illuminated region of the photoresist of the layer 24C is activated by the light to respond to a subsequent step of etching (FIG. 6). In accordance with well-known practices in the manufacture of semiconductor devices, etching may be done with a developer such as potassium hydroxide which etches away the illuminated portion of the photoresist material to form an opening 30 in the layer 24C. The etchant is provided, by way of example, by an etchant source 40 depicted as a device for delivering etchant as by spraying the etchant on the layer 24C. Subsequent to the etching step, a source 42 of ultraviolet radiation is employed to radiate the layer 24C so as to harden the material of the layer 24C, the term hardening being used to indicate that the resist material is no longer sensitive to illumination by light of the lamp 34. The hardening step may or may not be required depending on the formulation of the photoresist and subsequent etches. The foregoing description relates to a positive photoresist, it being understood that the practice of the invention includes a mask made by a negative resist.

In FIG. 7, fabrication of the resist structure continues with deposition of the fourth layer 24D, this being a layer of photoresist as has been noted above. The fourth layer 24D may be referred to as Resist 2. The depth, x, of the fourth layer 24D is shown greater than the depth, y, of the third layer 24C for purposes of illustrating the invention, it being understood, also, that x may be equal to or less than y if desired.

In FIG. 8, the lamp 34 and a mask 44 are arranged above the structure 28 with the mask 44 disposed between the lamp 34 and the fourth layer 24D. The mask 44 is aligned to the structure 28, and has an opaque region 46 and a transparent, or open, region 48. The lamp 34 directs light towards a mask 44 with rays of the light propagating through the transparent region 48. The rays of light from the lamp 34 penetrate both the fourth layer 24D and the third layer 24C. Resist material of the fourth layer 24D is activated by the light to be responsive to an etchant of a subsequent etchant step depicted in FIG. 9. However, the resist material of the third layer 24C has been hardened (FIG. 6) and, as noted above, has been rendered insensitive to illumination by the light of the lamp 34. Therefore, in the subsequent etching step of FIG. 9, only the resist material of the layer 24D will be affected by the etchant, and the configuration of the layer 24C including the configuration of the opening 30 will remain unchanged in the subsequent etching step of FIG. 9.

In FIG. 9, the etchant source 40 is employed again to remove photoresist from the region illuminated in FIG. 8. By way of example in the use of the photolithographic step of FIG. 8 and the etching step of FIG. 9, a boundary 50 (FIG. 8) of the illuminated region, and a resulting edge 50A (FIG. 9) of a recess 52 produced by the etching of FIG. 9 intersect the opening 30 (FIG. 8) resulting in a smaller opening 54 (FIG. 9) which extends from the recess 52.

In FIGS. 10 and 11, the opening 54 is extended in length by etching away a part of the second layer 24B (FIG. 10) and a corresponding part of the first layer 24A (FIG. 11). In accordance with a feature of the invention, in FIG. 10, the etching of the material of the second layer 24B is accomplished by use of an etchant which selectively etches the material of the layer 24B without having any significant etching effect on the materials of the other layers 24. Thus, in FIG. 10, the chromium may be etched by use of liquid ceric ammonium nitrate in nitric acid, or by use of a dry ion plasma etch employing chloride ions in the plasma. For example, the plasma etch may be accomplished in a vacuum employing an electric field, with the vacuum chamber employing argon, and carbon tetrachloride as a source 56 of these ions. Subsequently, in FIG. 11, the source 58 provides an etchant suitable for the selective etching of the material of the first layer 24A, the etchant of FIG. 11 having essentially no effect upon the material of other ones of the layers 24. In a preferred embodiment of the invention, the preferred etchant in the etching step of FIG. 11 is a dry plasma etch, a reactive ion etch (RIE) of $CHF_3+O_2$ which is well suited for producing a narrow trough, or a narrow diameter hole such as the extension of the opening 54. By way of example in the use of the completed mask, the hole may be used to form a via connection with a conductor shape formed in the trough in a subsequent metalization procedure. Alternatively, a wet etch of buffered hydrofluoric acid may be employed. Other etches which may be employed for etching the material of the first layer 24A do not have as great a selectivity in the etching because they tend to attack also the materials of the layers 24, and make dimensional control more difficult. Such etches are nitrogen trifluoride plus argon, and also carbon tetrafluoride plus oxygen.

The foregoing selection of materials to be used in the various layers 24, as well as etches which can selectively etch the materials of individual ones of the layers 24 demonstrates an important aspect of the invention which allows the mask 20 to be constructed by use of photolithographic and etching steps. As shown in the foregoing steps, the invention has provided also for the extension of the opening 54 by a depression 60 into the first two layers 24A and 24B. It is also noted that also, by locating the boundary 50 (FIG. 8) of the light beam within the opening 30, and the resultant production of the edge 50A (FIG. 9), it has been possible by back-filling the opening 30 (FIG. 7) with material of the fourth layer 24D to create the opening 54 and the depression 60 with a cross-sectional dimension which is smaller than that of the opening 30.

In FIG. 12, a source 62 of etchant is employed to remove the portion of the third layer 24C lying between the boundary 50 and a boundary 64 (FIG. 8) of the light beam defined by the transparent region 48 of the mask 44. In the etching step of FIG. 9, an edge 64A of the recess 52 is produced at the location of the boundary 64 of the light beam. The edge 64A is extended through the third layer 24C up to the top surface of the second layer 24B by the etching process of FIG. 12. The etching in FIG. 12 is accomplished by RIE with oxygen in an optional environment of argon. It is noted that the etching of FIG. 12 attacks both the unhardened layer 24D and the hardened layer 24C without attacking the first two layers 24A and 24B. This is in accordance with the above noted aspect of the invention in which etches are selected to provide for selected etching in accordance with the selection of materials of the various layers 24.

It is noted that the etchant of FIG. 12 attacks the resist in both of the layers 24D and 24C. However, since the layer 24D was prepared with a thickness greater than that of the layer 24C, some of the layer 24D remains in the structure of FIG. 12 to provide increased protection of the layer 24B during the etching step of FIG. 13. If the layer 24D were prepared with a thickness less than that of the layer 24C, then, in FIG. 12, none of the material in the horizontal portions of the layer 24D would appear, and the layer 24C would appear reduced in thickness.

FIGS. 12–14 show the final steps in the fabrication of the mask 20. The etching of FIG. 12 has exposed a portion 66 of the second layer 24B lying between the depression 60 and the edge 64A. Exposure of the portion 66 in FIG. 12 prepares the portion 66 for a further etching shown in FIG. 13. FIG. 13, the etching step is performed by use of the source 56, previously disclosed in FIG. 10, for etching the chromium of the second layer 24B. This produces the structure shown in FIG. 13. The etching away of the portion 66 of the second layer 24B exposes a corresponding portion 68 (FIG. 13) of the first layer 24 A. The portion 68 extends from the depression 60 to the edge 64A. Finally, in FIG. 14, there is a further etching step utilizing the source 62, previously described in reference to FIG. 12, in which the remaining portions of the material in each of the layers 24C and 24D are removed, by example, with 02 RIE.

FIG. 14 shows the resulting mask 20 which is constructed to provide for differing transmissivities of light. The regions of the mask 20 having portions of the second layer 24B are opaque to light. The exposed portion 68 of the first layer 24A is partially transmissive to light. In the depression 60, both of the layers 24A and 24B are absent so as to permit full transmission of light through the transparent substrate 22. Thereby, the mask 20 attains the gray scale function by providing full transmission of light at the site of the depression 60, partial transmission of light at the exposed portion 68 of the first layer 24A, and zero transmission of light at the remaining portions 70 and 72 of the opaque layer 24B.

FIG. 15 shows diagrammatically a lithographic system employing the mask 20 in conjunction with a lamp and a table for holding a workpiece. The table positions the workpiece in front of the lamp, and the mask 20 is positioned between the lamp and the workpiece for illuminating the workpiece with a pattern of light established by the mask 20. The pattern of light includes shaded regions produced by the portions 70 and 72, a strongly illuminated region at the depression 60 and a weakly illuminated region at the portion 68. Thereby, the mask 20 can be employed in a lithographic process for providing differing levels of illumination.

Figure 16:
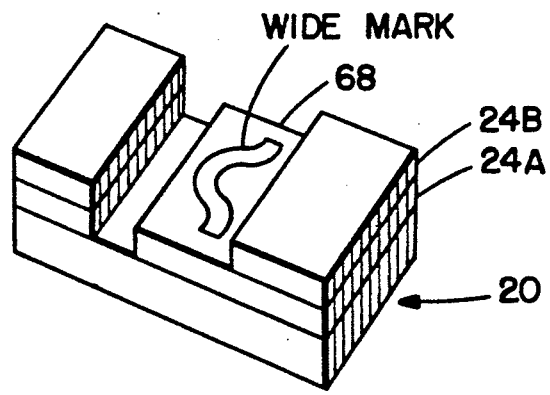
FIGS. 16–18 disclose in stylized perspective view an adjustment of optical transmissivity in a glass film layer of a completed mask by use of a laser heating beam and an electron writing beam for reconfiguring a relatively opaque mark on the glass film.
Figure 17:
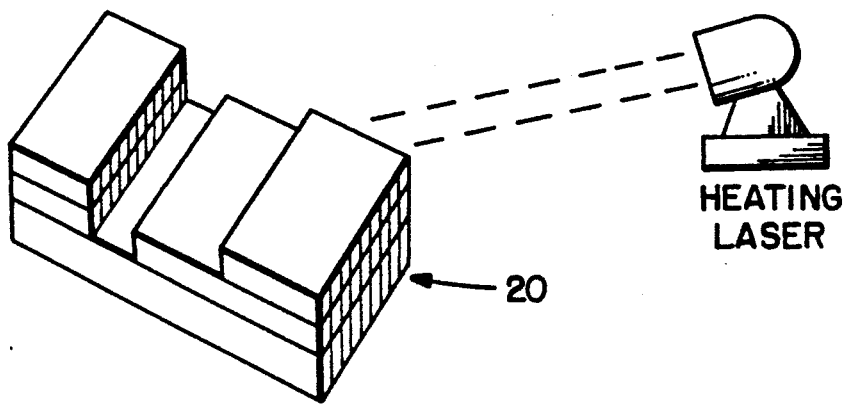
Figure 18:
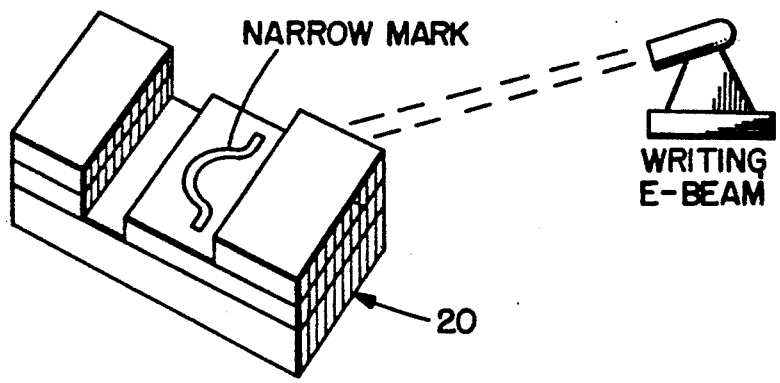

It is noted that, in accordance with the practice of the invention, additional layers of partially transmissive material may be employed in the construction of a mask, such as the mask 20, to provide multiple layers of gray level illumination. In accordance with a further feature of the invention, it is noted that the glass filter of the first layer 24A has an opacity produced by the presence of the substituted silver ions (as described in the aforementioned patents of Wu). As has been described above, the opacity can be increased by exposing the first layer 24A to radiation of an electron beam, and can be reduced by a heating of the first layer 24A by exposure to a laser beam. An increase in the opacity produces a decrease in the optical transmissivity of the glass of the layer 24A, and vice-versa. Advantage may be taken of this characteristic of the glass filter in the fabrication of the mask, as is disclosed in FIG. 2 wherein, subsequent to the step of depositing the first layer 24A, but prior to the step of depositing the second layer 24B, the layer 24A may be radiated with an electron beam for reacting with the silver to increase the opacity, or by radiating with a laser to heat the layer 24A to reverse the reaction of the silver so as to regain the optical, or light, transmissivity. These additional fabrication steps, as indicated in simplified form in FIG. 2, provide greater versatility in the fabrication of the mask 20 so as to allow customizing of the mask 20 for use in specific manufacturing processes, such as the manufacture of a specific semiconductor device With reference also to FIGS. 16-18, if desired, the electron beam can be directed to specific regions of the first layer 24A by use of a well-known mask or beam-deflection electronics to produce differing levels of opacity at different locations of the glass filter of the first layer 24A. FIG. 16 shows a situation wherein the layer 24A of a completed mask 20 is provided with a relatively opaque mark located within a surrounding region of greater opacity. By way of example, the mark is portrayed as an elongated arcuate mark having a width greater than is desired for a specific manufacturing application in which the mask 20 is to be employed. It is desired to reduce the width of the mark. This is accomplished by irradiating the portion 68 of the glass filter layer 24A with a laser beam (FIG. 17) to heat the glass material, and reduce the opacity of the mark to that of the surrounding region. Then, as shown in FIG. 18, electron-beam apparatus provides a beam, considerably narrower than the laser beam and having a shorter wavelength than the laser beam, for writing a new mark of desired width upon the exposed portion 68 of the layer 24A. The electron beam reacts with the glass material to decrease light transmissivity in the locations illuminated by the electron beam and, thereby generate the mark with the desired reduction in width.

FIGS. 19-31 show a sequence of steps of a process for the manufacture of the mask 20, this process being an alternative to the process disclosed in FIGS. 1-14. There are similarities between the two processes. FIGS. 27-30 show three layers 24A, 24B and 24C which are composed of the same materials and have the same thicknesses as do the layers 24A, 24B and 24C of FIGS. 4-13. Also, in both processes, the foregoing layers are supported upon the substrate 22. The etchant sources 40, 56, and 58 are employed also in the alternate process of FIGS. 19-31, and function in the same manner as has been described with reference to the process of FIGS. 1-14. In addition, the lamp 34 and the masks 32 and 44 are employed in the alternate process of FIGS. 19-31, and function in the same manner as has been described with reference to the process of FIGS. 1-14.

Figure 19:
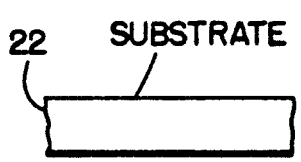
FIGS. 19–31 show a succession of steps in the fabrication of a mask in accordance with an alternative fabrication process of the invention, the steps being indicated diagrammatically.
Figure 20:
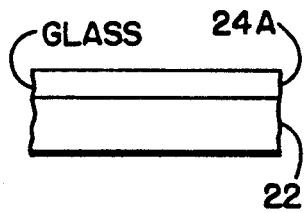
Figure 21:
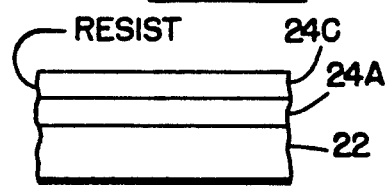
Figure 22:
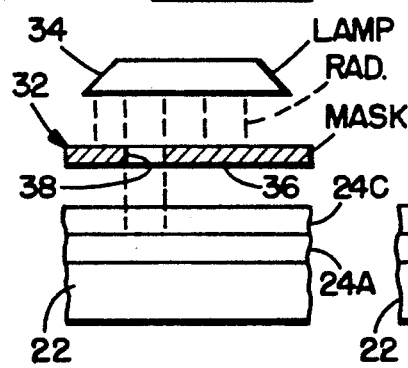

The alternate process for fabrication of the mask 20 begins with preparation of the substrate 22 in FIG. 19. Thereupon, the glass layer 24A is deposited upon the top surface of the substrate 22 in FIG. 20, this being followed by a deposition of the resist layer 24C upon the top surface of the glass layer 24A in FIG. 21. In FIG. 22, the mask 32 and the lamp 34 are employed to illuminate the resist layer 24C with radiation to expose predetermined regions of the resist layer 24C in correspondence with the image of the mask 32, one such exposed region being shown in FIG. 22 beneath a transparent region 38 of the mask 32.

Figure 23:
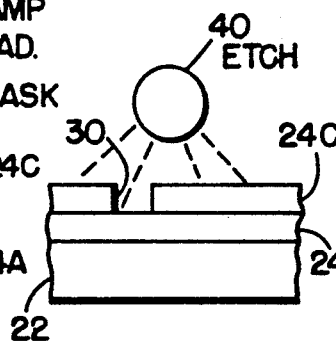
Figure 24:
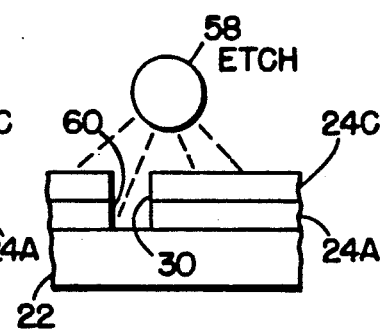
Figure 25:
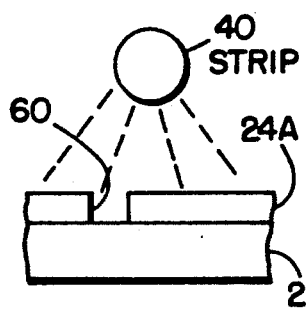

The process continues with three etching steps disclosed in FIGS. 23-25. In FIG. 23, the etchant of the source 40 removes the portion of the resist layer 24C which has been exposed to the radiation in FIG. 22, the removal of the portion of the layer 24C producing the opening 30 and configuring the layer 24C in the form of a mask to be used in the subsequent etching steps of FIGS. 24 and 25. It is noted that, in FIG. 23, the etchant attacks only the resist layer 24C, and leaves the glass layer 24A intact. In FIG. 24, the etchant of the source 58 preferentially attacks the exposed portion of the glass layer 24A, beneath the opening 30, and leaves the resist layer 24C intact. The etchant of the source 58 removes the material of the exposed region of the glass layer 24A down to the top surface of the substrate 22 to form the depression 60 in the glass layer 24A. Upon completion of the depression 60, the remainder of the resist layer 24C is stripped away by etchant of the source 40, as shown in FIG. 25.

Figure 26:
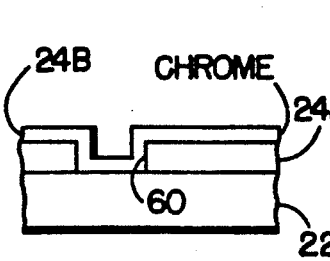
Figure 27:
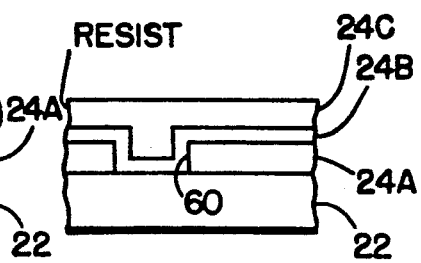
Figure 28:
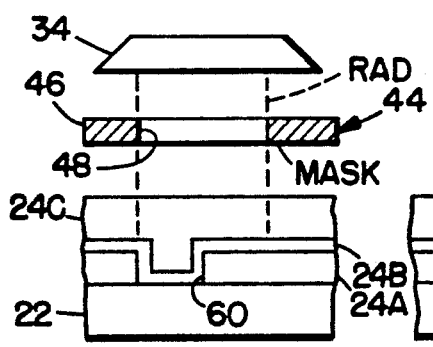

In FIG. 26, a chromium layer 24B is deposited conformally upon the top surface of the glass layer 24A and upon the exposed portion of the substrate 22 at the bottom of the depression 60. This is followed, in FIG. 27, by a deposition of a resist layer 24C upon the top surface of the chromium layer 24B. In FIG. 28, the lamp 34 and the mask 44 are employed to expose predetermined regions of the resist layer 24C with radiation of the lamp 34. The radiation propagates through transparent regions of the mask 44, one transparent region 48 being shown in FIG. 28. The exposure of the predetermined regions of the resist layer 24C by the radiation in FIG. 28 prepares the resist layer 24C for subsequent etching steps of FIGS. 29 and 30.

Figure 29:
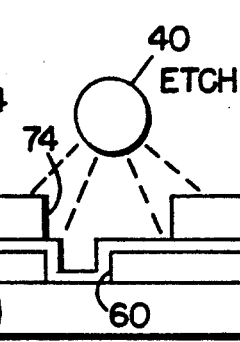
Figure 30:
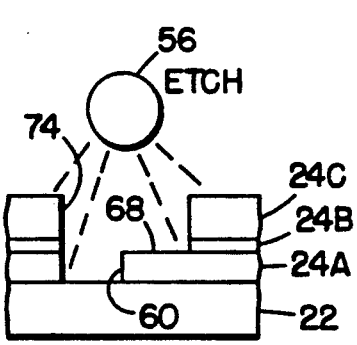
Figure 31:
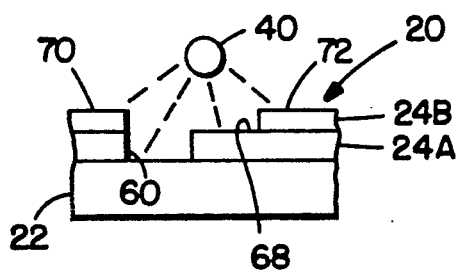

In FIG. 29, etchant of the source 40 attacks the regions of the resist layer 24C which have been exposed to the radiation in the step of FIG. 28, the etchant of the source 40 removing material of the resist layer 24C in the exposed regions while leaving the chromium layer 24B intact. The removal of material at the predetermined regions of the resist layer 24C leaves openings, one such opening 74 being shown in FIG. 29, which configure the resist layer 24C in the form of a mask suitable for the etching step of FIG. 30. In FIG. 30, etchant of the source 56 propagates through the opening 74 to etch preferentially the chromium of the layer 24B while leaving material of the resist layer 24C and material of the glass layer 24E and material of the substrate 22 intact. In particular, it is noted that the etching step of FIG. 30 removes chromium from the vertical and horizontal surfaces of the depression 60 of the glass layer 24A, and also exposes the portion 68 of the top surface of the glass layer 24A to produce the configuration of a step as shown in FIG. 30. Finally, at FIG. 31, the remaining portion of the resist layer 24C is stripped away to produce the completed mask 20. The stripping of the resist layer 24C in FIG. 31 is accomplished in the same fashion as has been disclosed in FIG. 25 by use of the etchant of the source 40. Thereby, the alternative process of FIGS. 19-31 has produced the mask 22 with the same configuration as has been fabricated by the process of FIGS. 1-14.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A method of fabricating a gray level mask having a plurality of layers of material of differing light transmissivity supported by a substrate, wherein a first of said layers partially overlaps the substrate to expose a part of the substrate, and a second of said layers partially overlaps the first layer to expose part of the first layer and said part of the substrate;

the method comprising steps of depositing a first layer on said substrate, said first layer being formed of a material having a first light transmissivity less than a light transmissivity of said substrate but greater than zero transmissivity;

depositing a second layer on said first layer, said second layer being formed of a material having a second light transmissivity less than the light transmissivity of said substrate but greater than or equal to zero, said first and said second layers constituting an assembly of layers;

forming a resist structure upon said layer assembly to serve as a mask, said forming including a step of treating a part of said resist structure to permit a preferential etching of said resist structure;

employing a first etchant which preferentially attacks said second layer to configure said second layer in accordance with the mask of said resist structure;

employing a second etchant which preferentially attacks said second layer to configure said first layer in accordance with the mask of said resist structure;

employing a third etchant which preferentially attacks said resist structure to reconfigure said resist structure to serve as a reconfigured mask;

reemploying said first etchant to reconfigure said second layer in accordance with the reconfigured mask; and stripping off said resist structure.

2. A method according to claim 1 wherein said depositing of said first layer includes a locating of said first layer to partially overlie said substrate, said second layer partially overlying said first layer.

3. A method according to claim 2 wherein, subsequent to said step of depositing said first layer, there is a further step of adjusting the light transmissivity of at least a part of said first layer.

4. A method according to claim 3 wherein said first layer comprises glass with silver ions substituted for alkaline metal, and wherein said step of adjusting the light transmissivity includes a radiating of said first layer with an electron beam to decrease light transmissivity.

5. A method according to claim 4 wherein said step of adjusting the light transmissivity includes a heating of said first layer to increase the light transmissivity.

6. A method according to claim 5 wherein said second etchant is a reactive ion etch with $CHF_3+O_2$ or a wet etch with buffered hydrofluoric acid, said first etchant is a reactive ion etch with chlorine, and said third etchant is a reactive ion etch with oxygen.

7. A method according to claim 1 wherein said first etchant is a reactive ion etch with buffered hydrofluoric acid or $CHF_3+O_2$, said second etchant is a reactive ion etch with chlorine, and said third etchant is a reactive ion etch with oxygen.

8. A method according to claim 1 wherein, subsequent to a completion of a fabricating of said mask, there is a further step of adjusting the light transmissivity of at least a part of said first layer.

9. A method according to claim 8 wherein said first layer comprises glass with silver ions substituted for alkaline metal, and wherein said step of adjusting the light transmissivity includes a radiating of said first layer with an electron beam to decrease light transmissivity.

10. A method according to claim 9 wherein said step of adjusting the light transmissivity includes a heating of said first layer to increase the light transmissivity.

11. A method according to claim 8 wherein said first layer comprises material having a light transmissivity responsive to radiant energy;

said step of adjusting the light transmissivity includes illumination of said first layer with laser radiation to accomplish a heating of a predetermined region of said first layer to increase the light transmissivity of said predetermined region above a desired level of transmissivity; and said step of adjusting the light transmissivity includes a further step of radiating said predetermined region of said first layer with an electron beam to decrease the light transmissivity of said predetermined region to said desired level of transmissivity.

12. A method according to claim 1 wherein said step of treating a part of said resist structure comprises a hardening of material of said resist structure.

13. A method of fabricating a gray level mask having a plurality of layers of material of differing light transmissivity supported by a substrate, wherein a first of said layers partially overlaps the substrate to expose a part of the substrate, and a second of said layers partially overlaps the first layer to expose part of the first layer and said part of the substrate;

the method comprising steps of depositing a first layer on said substrate, said first layer being formed of a material having a first light transmissivity less than a light transmissivity of said substrate but greater than zero transmissivity;

adjusting the light transmissivity of said first layer;

depositing a second layer on said first layer, said second layer being formed of a material having a second light transmissivity less than the light transmissivity of said substrate but greater than or equal to zero, said first and said second layers constituting an assembly of layers;

forming a resist structure upon said layer assembly to serve as a mask;

selectively etching said assembly of layers, said step of selectively etching comprising steps of employing a second etchant which preferentially attacks said first layer to configure said first layer in accordance with the mask of said resist structure, employing a third etchant which preferentially attacks said second layer to reconfigure said resist structure to serve as a reconfigured mask, and subsequently employing a first etchant which preferentially attacks said second layer in accordance with the reconfigured mask to configure said second layer; and stripping off said resist structure.

14. A method of fabricating a gray level mask having a plurality of layers of material of differing light transmissivity supported by a substrate, wherein a first of said layers partially overlaps the substrate to expose a part of the substrate, and a second of said layers partially overlaps the first layer to expose part of the first layer and said part of the substrate;

the method comprising steps of depositing a first transmission layer on said substrate, said transmission layer being formed of a material having a first light transmissivity;

depositing a first resist layer upon said first transmission layer;

etching said first resist layer to configure said first resist layer as a first mask;

through said first mask, etching said first transmission layer to configure said first transmission layer;

removing said first resist layer;

a second transmission layer on said first transmission layer, said second transmission layer being formed of a material having a second light transmissivity lying within a range of values including zero transmissivity depositing a second resist layer upon said second transmission layer etching said second resist layer to configure said second resist layer as a second mask;

through said second mask, etching said second transmission layer to configure said second transmission layer; and removing said second resist layer.

15. A method according to claim 14 wherein said depositing and said etching of said first transmission layer locates the material of said first transmission layer to partially overlie said substrate, the material of said second transmission layer partially overlying said first transmission layer.

16. A method according to claim 14 wherein, subsequent to said step of depositing said first transmission layer, there is a further step of adjusting the light transmissivity of at least a part of said first transmission layer.

17. A method according to claim 16 wherein said first transmission layer comprises glass with silver ions substituted for alkaline metal, and wherein said step of adjusting the light transmissivity includes a radiating of said first transmission layer with an electron beam to decrease light transmissivity of said first transmission layer.

18. A method according to claim 16 wherein said step of adjusting the light transmissivity includes a heating of said first transmission layer to increase the light transmissivity of said first transmission layer.

19. A method according to claim 14 wherein, subsequent to a completion of a fabricating of said mask, there is a further step of adjusting the light transmissivity of at least a part of said first transmission layer.

20. A method according to claim 19 wherein said first transmission layer comprises glass with silver ions substituted for alkaline metal, and wherein said step of adjusting the light transmissivity includes a radiating of said first transmission layer with an electron beam to decrease light transmissivity.

21. A method according to claim 20 wherein said step of adjusting the light transmissivity includes a heating of said first transmission layer to increase the light transmissivity.

22. A method according to claim 14 wherein said first transmission layer comprises material having a light transmissivity responsive to radiant energy;

said step of adjusting the light transmissivity includes illumination of said first transmission layer with laser radiation to accomplish a heating of a predetermined region of said first transmission layer to increase the light transmissivity of said predetermined region above a desired level of transmissivity; and said step of adjusting the light transmissivity includes a further step of radiating said predetermined region of said first transmission layer with an electron beam to decrease the light transmissivity of said predetermined region to said desired level of transmissivity.

23. A method according to claim 14 wherein said step of etching said first transmission layer produces an opening in said first transmission layer, said opening extending to said substrate; and said step of etching said second transmission layer is terminated by a step of observing said substrate, said observing step preserving a desired depth of said first transmission layer by terminating said etching of said second transmission layer.

24. A method of fabricating a gray level mask having a plurality of layers of material of differing light transmissivity supported by a substrate, wherein a first of said layers partially overlaps the substrate to expose a part of the substrate, and a second of said layers partially overlaps the first layer to expose part of the first layer and said part of the substrate; the method comprising steps of depositing a first layer on said substrate, said first layer being formed of a material having a first light transmissivity less than a light transmissivity of said substrate but greater than zero transmissivity; depositing a second layer on said first layer, said second layer being formed of a material having a second light transmissivity less than the light transmissivity of said substrate but greater than or equal to zero, said first and said second layers constituting an assembly of layers, the materials of said second layer and said first layer being responsive respectively to selective etchings of a first etchant and a second etchant;

forming a first resist structure upon said layer assembly, said first resist structure having a first opening extending through said first resist structure to said second layer;

forming a second resist structure upon said first resist structure, wherein said forming of said first resist structure includes a step of treating said first resist structure to permit a preferential etching of said first and said second resist structures wherein said first resist structure is responsive to etching by a third etchant and said second resist structure is responsive to etching by said third etchant and by a fourth etchant, material of said second resist structure filling said first opening;

etching the material of said second resist structure to produce a second opening in said second resist structure, said second opening extending through said second resist structure to said first resist structure, an end portion of said second opening extending part way over said first opening, said etching extending through said first opening to said second layer to produce a third opening having a cross-sectional dimension smaller than the corresponding cross-sectional dimension of said first opening;

employing said first etchant which preferentially attacks said second layer via said third opening to configure said second layer;

employing said second etchant which preferentially attacks said first layer via said third opening to configure said first layer;

employing said third etchant which preferentially attacks said first resist structure via said second opening to extend said second opening to said second layer;

reemploying said first etchant via said second opening to reconfigure said second layer; and stripping off said first and said second resist structures.

25. A method of fabricating a gray level mask having a plurality of layers of material of differing light transmissivity supported by a substrate, wherein a first of said layers partially overlaps the substrate to expose a part of the substrate, and a second of said layers partially overlaps the first layer to expose part of the first layer and said part of the substrate;

the method comprising steps of depositing a first layer on said substrate, said first layer being formed of a material having a first light transmissivity less than a light transmissivity of said substrate but greater than zero transmissivity;

depositing a second layer on said first layer, said second layer being formed of a material having a second light transmissivity less than the light transmissivity of said substrate but greater than or equal to zero, said first and said second layers constituting an assembly of layers;

forming a first resist structure upon said layer assembly, said first resist structure having a first opening extending through said first resist structure to said second layer;

forming a second resist structure upon said first resist structure, wherein said forming of said first resist structure includes a step of treating said first resist structure to permit a preferential etching of said first and said second resist structures wherein said first resist structure is responsive to etching by a third etchant and said second resist structure is responsive to etching by said third etchant and by a fourth etchant, material of said second resist structure filling said first opening;

etching the material of said second resist structure to produce a second opening in said second resist structure, said second opening extending through said second resist structure to said first resist structure, an end portion of said second opening extending part way over said first opening, said etching extending through said first opening to said second layer to produce a third opening having a cross-sectional dimension smaller than the corresponding cross-sectional dimension of said first opening to serve as a mask;

employing a first etchant which preferentially attacks said second layer via said third opening to configure said second layer via said third opening to configure said second layer in accordance with the mask of said resist structure;

employing a second etchant which preferentially attacks said first layer via said third opening to configure said first layer in accordance with the mask of said resist structure;

employing said third etchant which preferentially attacks said first resist structure via said second opening to extend said second opening to said second layer;

reemploying said first etchant via said second opening to reconfigure said second layer; and stripping off said first and said second resist structures.

* * * * *

UNITED STATES PATENT AND TRADEMARK OFFICE
CERTIFICATE OF CORRECTION

PATENT NO. : 5,213,916
DATED : May 25, 1993
INVENTOR(S) : Cronin, et. al.

It is certified that error appears in the above-indentified patent and that said Letters Patent is hereby corrected as shown below:

In col. 9, line 47 please omit "second" and replace with --first--.

In col. 11, line 32 please insert --depositing-- at the start of the paragraph before the phrase "a second transmission".

In col. 11, line 36 please insert a ";" after the word "transmissivity".

In col. 14, lines 30-31 please omit the phrase "via said third opening to configure said second layer".

Signed and Sealed this

First Day of February, 1994

Attest:

BRUCE LEHMAN

*Attesting Officer*    *Commissioner of Patents and Trademarks*